US00RE35442E

United States Patent [19]

Contiero et al.

[11] E Patent Number: Re. 35,442

[45] Reissued Date of Patent: Feb. 4, 1997

[54] MIXED TECHNOLOGY INTEGRATED CIRCUIT COMPRISING CMOS STRUCTURES AND EFFICIENT LATERAL BIPOLAR TRANSISTORS WITH A HIGH EARLY VOLTAGE AND FABRICATION THEREOF

[75] Inventors: Claudio Contiero, Buccinasco; Paola Galbiati, Monza; Lucia Zullino, Milan, all of Italy

[73] Assignee: SGS-Thomson Microelectronics, S.r.l., Agrate Brianza, Italy

[21] Appl. No.: 183,011

[22] Filed: Jan. 14, 1994

Related U.S. Patent Documents

Reissue of:

[64] Patent No.: 5,081,517
Issued: Jan. 14, 1992
Appl. No.: 548,711
Filed: Jul. 6, 1990

[51] Int. Cl.[6] ..... H01L 29/76

[52] U.S. Cl. ..... 257/370; 257/378; 257/544; 257/548; 257/550; 257/557

[58] Field of Search ..... 257/370, 378, 257/548, 550, 557, 544

[56] References Cited

U.S. PATENT DOCUMENTS

| | | | |
|---|---|---|---|
| 4,642,667 | 2/1987 | Magee . | |
| 4,669,177 | 6/1987 | D'Arrigo et al. . | |
| 4,812,891 | 3/1989 | Bingham | 257/370 |
| 4,829,357 | 5/1989 | Arndt | 257/370 |
| 5,070,381 | 12/1991 | Scott et al. . | |
| 5,262,345 | 11/1993 | Nasser et al. . | |

FOREIGN PATENT DOCUMENTS

| | | | |
|---|---|---|---|
| 89830298 | 1/1990 | European Pat. Off. . | |
| 63-136659 | 6/1988 | Japan | 257/370 |

OTHER PUBLICATIONS

Beasom, "A high performance high voltage lateral PNP structure," 1983 International Electron Devices Meeting 424ff (paper 16.5)–Jan.

Vittoz, "MOS transistors operated in the lateral bipolar mode and their application in CMOS technology,"–18 IEEE Journal of Solid–State Circuits 273ff (1983)–Jan.

Schade et al., "Complementary DMOS/BICMOS Technology for ower IC applications," 1988 International Electron Devices Meeting 796ff –Feb.

Sugawara et al., "A high performance, high voltage lateral pnp transistors," Extended Abstracts of the 16th (1984 International) Conference on Solid State Devices and Materials pp. 317ff (1984)–Feb.

Inohira et al., "Merged bipolar transistor models including the substrate current," 73 Electronics and Communications in Japan, Part 2 (Electronics) pp. 10ff (Mar. 1990)–Jan.

Malhi et al., "The Early voltage of a lateral PNP transistor," 21 Solid–State Electronics 1187ff (1978)–Mar.

(List continued on next page.)

*Primary Examiner*—Edward Wojciechowicz
*Attorney, Agent, or Firm*—Betty Formby; Robert Groover

[57] ABSTRACT

A high density, mixed technology integrated circuit comprises CMOS structures and bipolar lateral transistors, the electrical efficiency and Early voltage of which are maintained high by forming "well" regions through the collector area. The operation determines the formation of a "collector extension region" extending relatively deep within the epitaxial layer so as to intercept the emitter current and gather it to the collector, subtracting it from dispersion toward the substrate through the adjacent isolation junctions surrounding the region of the lateral bipolar transistor. Under comparable conditions, the ratio between Iclsubstrate is incremented from about 8 to about 300 and the Early voltage from about 20V to about 100V. The $V_{CEO}$, $BV_{CBO}$ and $BV_{CES}$ voltages are also advantageously increased by the presence of said "well" region formed in the collector zone.

34 Claims, 1 Drawing Sheet

OTHER PUBLICATIONS

Murari, "Power Integrated Circuits: Problems, Tradeoffs, and Solutions," 13 IEEE Journal of Solid–State Circuits 307ff (1978)–Jan.

Hatcher, "A practical high gain lateral pnp for integrated circuit use," 1967 International Electron Devices Meeting p. 12–Jan.

Blanchard et al., "High–Voltage Simultaneous Diffusion Silicon–Gate CMOS," 9 J. Solid–State Circuits 103ff (1974)–Jan.

Einziger et al., "Monolithic IC Power Switch for Automotive Applications," 1986 ISSCC 22ff–Jan.

MIXED TECHNOLOGY INTEGRATED CIRCUIT COMPRISING CMOS STRUCTURES AND EFFICIENT LATERAL BIPOLAR TRANSISTORS WITH A HIGH EARLY VOLTAGE AND FABRICATION THEREOF

Matter enclosed in heavy brackets [ ] appears in the original patent but forms no part of this reissue specification; matter printed in italics indicates the additions made by reissue.

*This application is a Reissue of 07/548,711, filed Jul. 6, 1990, now U.S. Pat. No. 5,081,517.*

BACKGROUND OF THE INVENTION

1. Field of the Invention

The present invention relates to a mixed technology integrated circuit wherein high density CMOS structures and lateral bipolar transistors having high Early voltage and electrical efficiency are integrated.

2. Description of the prior art

Mixed technology integrated circuits are finding growing opportunities of utilization because of their exceptional versatility. On the other hand the request for an ever increasing density of these integrated devices in order to increase miniaturization of the systems emphasizes compatibility problems in forming different technology structures such as bipolar transistors and MOS (CMOS) transistors monolithically integrated in the same chip.

In particular, the realization of high density mixed technology integrated circuits necessarily implies, according to the most modem fabrication processes, a drastic reduction of the junction depth of diffusions. This fact, while bringing important advantages in making effective CMOS structures, tends to penalize electrical efficiency and Early voltage characteristics of lateral bipolar transistors. In fact in first-generation, mixed technology integrated circuits wherein the isolation field oxide was geometrically defined after its formation and wherein the junction depth remained relatively large (e.g. from 3 to 4 pm for $p^+$ diffusions), the efficiency of lateral bipolar transistors remained satisfactory, but the structures could not be made very dense. Vice versa in mixed technology integrated circuits made in accordance with the most modem techniques, which contemplate the growth of the isolation field oxide on areas pre-defined by means of a silicon nitride mask and the formation in a self-alignment mode of superficially enriched well regions, a high density of the integrated structures may be obtained, though accompanied by a consistent drop of electrical efficiency of lateral bipolar transistors because of a dramatically increased loss of collector current toward the isolation junctions (and the substrate) which surround the transistor region.

This mechanism is schematically depicted in FIGS. 1 and 2, wherein a partial schematic cross section of a first generation, mixed technology integrated device and of a similar integrated device made in accordance with the most modem techniques are respectively depicted. Symbols and polarities of the different regions and diffusions are customary and immediately comprehended by a skilled technician without requiring a redundant detailed description thereof.

As indicatively shown by the arrows departing from the emitter junction of the bipolar transistor (PNP in the shown example) and which identify the current lines, in the case of the low density of integration device of FIG. 1, the major portion of the emitter current is effectively gathered by the transistor's collector. On the contrary in a high density integrated device made according to modern techniques, as depicted in FIG. 2 disregarding the accuracy of a scale representation between the two figures, wherein the collector junction depth is typically only 0.7 μm, a consistent portion of the emitter current is lost to ground through the p-silicon substrate of the integrated device, being gathered by the p-type isolation junction of the transistor.

In this kind of devices, the ratio between the collector current and the current lost through the isolation junction: Ic/Isubstrate, is evaluated to be about 8, while the Early voltage presented by the lateral PNP transistor is only about 20 V.

This drop of electrical efficiency of lateral bipolar transistors cannot be avoided because in order to increase the integration density especially of CMOS structures it is necessary to reduce the lithographic dimensions, the junction depths and to employ a field oxide formed so as to permit the formation in a self-alignment mode of the superficial enrichment regions of the well (p-well in the case shown in FIG. 2) which are necessary for preventing undesired superficial inversions (creation of parasitic MOS transistors) and these restraints determine the above discussed problem in lateral bipolar transistors. In fact for countering the loss of current toward the substrate, the collector is made as close as possible to the emitter causing in turn a low Early voltage.

OBJECTIVES AND SUMMARY OF THE INVENTION

Vis-à-vis this state of the art, the present invention has as an objective the provision of high density, mixed technology integrated circuits wherein lateral bipolar transistors maintain a high electrical efficiency and a high Early voltage.

It is a further objective of the invention to provide a method for fabricating such an improved high density, mixed technology integrated circuit.

According to the present invention, through the collector area of a lateral bipolar transistor, the electrical efficiency and Early voltage of which must be desirably increased, a "well" diffusion (of the same polarity of the collector junction diffusion) is formed, which extends beyond the diffusion profile of the collector junction, deep within the epitaxial layer in order to intercept the [current lines] *lines of carrier (hole) flow* departing from the emitter junction and to gather such a [current] *carrier flow* to the collector thus subtracting it from dispersion toward adjacent isolation diffusions which surround the transistor region.

The different aspects and advantages of the invention will be more easily recognized through the following detailed description of a preferred embodiment thereof having purely illustrative and not limitative purposes.

DESCRIPTION OF THE PREFERRED EMBODIMENT OF THE INVENTION

Figure 3:
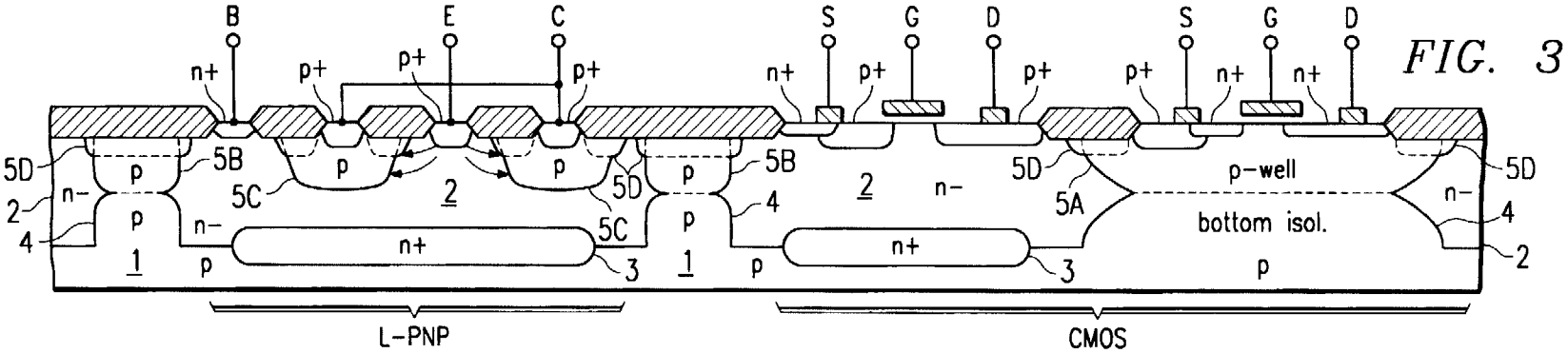
FIG. 3 is a partial schematic cross section view of a high density, mixed technology integrated circuit made in accordance with the instant invention.

As schematically shown in FIG. 3, the high density, mixed technology integrated circuit of the invention comprises, according to a preferred embodiment thereof, a monocrystalline p-type silicon substrate 1, doped with boron and having a bulk resistivity comprised between 10 and 20 ohms×cm, on which a low conductivity $n^-$ epitaxial layer 2 is grown. The $n^-$ buried layers 3 and the bottom isolation p-type diffusions 4 are made in accordance with normal fabrication techniques of this type of integrated devices. According to the same known techniques of fabrication, predefined areas of the surface of the epitaxial layer 2 are implanted with boron for forming, through a subsequent diffusion of the boron, the [p- w e 1 1] *p-well* regions 5A which are used as body regions within which n-channel transistors of the CMOS structures are formed and eventually as base regions of NPN type lateral bipolar transistors (not depicted in the figure) and further used as top isolation diffusions 5B which merge with the corresponding bottom isolation diffusions 4 to form isolation walls of p-type silicon around the active areas of different devices.

According to the present invention, the same diffusion profile of the p-well 5A of the n-channel MOS transistors and of the top isolations 5B is utilized for forming a more efficient collector's deep junction (a collector extension region) of the lateral PNP transistor (region 5C), as evidenced in the figure by means of a thick line, without introducing additional process steps.

Optionally, superficial dopant enriched regions 5D (also known as channel stopper regions) may be advantageously formed at the top of said p-type regions 5A, 5B and 5C.

Commonly these "well" regions 5A, 5B and therefore also such a region [in] *5C extend into* the epitaxial layer for a depth of about 4–6 μm and, in the case of the lateral PNP transistor shown, the region 5C offers an effective barrier to the dispersion of the current (represented by the arrows) toward the adjacent isolation diffusions 5B and 4. The effect of the 5C region formed in the collector zone which surrounds the emitter zone of the transistor may be easily illustrated graphically by comparing the high density structure of the invention depicted in FIG. 3 with a comparable high density structure shown in FIG. 2 made in accordance with the prior art and not having such a 5C region.

Figure 1:
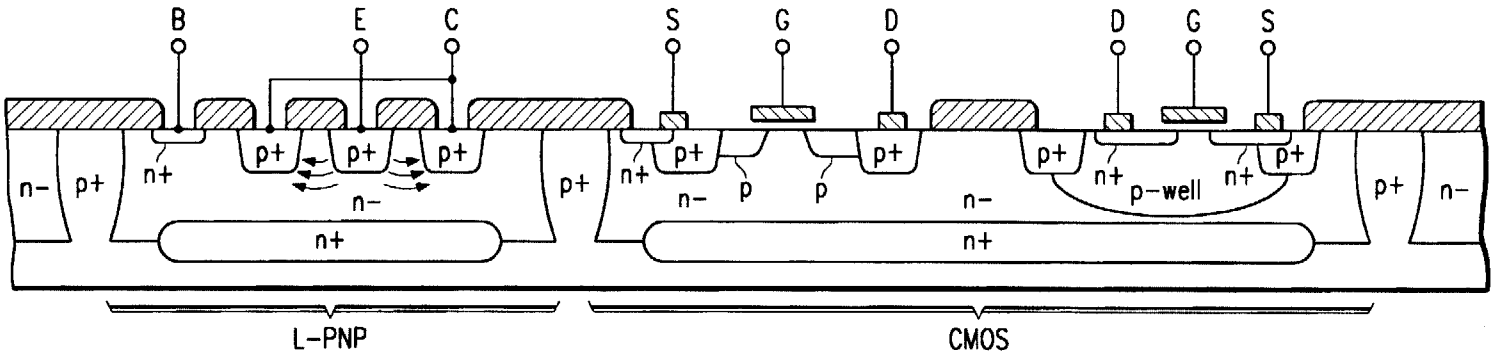
FIG. 1 (PRIOR ART)
FIG. 1 shows a partial schematic cross section of a mixed technology integrated circuit made according to a first known technique.
Figure 2:
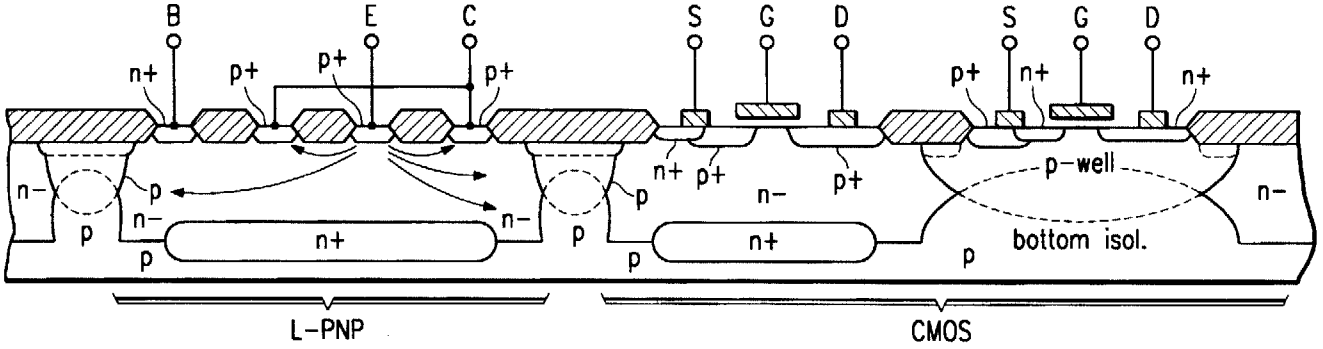
FIG. 2 (PRIOR ART)
FIG. 2 is a partial schematic cross section of a high density, mixed technology integrated circuit made in accordance with a more recent known technique.

The previously discussed ratio Ic/Isubstrate which, or other structural parameters being the same, in the case of the PNP transistor of FIG. 2 was equal to about 8, surprisingly reaches about 300 in the case of the comparable PNP transistor made in accordance with the present invention and provided with the region 5C in the collector zone.

Moreover the presence of a lightly doped region such as the region 5C [is] (substantially a p-well region) in the collector region of the PNP transistor remarkably increases the Early voltage which may reach a value greater than 100 V. The $V_{CEO}$ voltage and the breakdown voltages BVCBO and BCES are also increased because said lightly doped collector region 5C, which could be called also a "collector extension region", sustains the greater part of the depletion when a reverse voltage is applied between the emitter and the collector of the transistor.

The fabrication process for making an integrated circuit in accordance with the present invention distinguishes itself from a standard fabrication process of these types of mixed-technology integrated devices by the fact that after having implanted the dopant in the top isolation areas, the dopant implantation for making the well regions is effected also on the collector areas of the relative lateral bipolar transistors in order that, following a subsequent diffusion heat treatment, collector extension regions (5C in FIG. 3) having the same diffusion profile of the well are formed. Of course [il] *it* will be possible to [preliminarly] *preliminarily* effect also on said collector areas an enrichment implantation as contemplated by a normal fabrication process for forming in a self-alignment mode enriched superficial regions (channel stopper) above the top isolation diffusions 5B and above the p-well diffusions 5A (indicated with 5D in FIG. 3).

After having realized the desired collector extension regions 5C simultaneously with the formation of the well regions and after having grown the isolation field oxide, the fabrication process may continue through a normal sequence of steps to the termination thereof.

As it will be evident to the skilled technician, what has been described in detail for the embodiment depicted in FIG. 3 is equally applicable in the case of an NPN lateral bipolar transistor in the context of an analog, mixed technology integrated circuit wherein all the polarities be inverted in respect to the polarities of the embodiment of FIG. 3.

Moreover the ranges of variation of the doping levels of the various regions of the silicon are also well known to the skilled technician. The indication: p-type silicon meaning substantially a silicon region moderately doped with boron while a $p^+$ type region representing a region heavily doped with boron. Similarly the low conductivity epitaxial region is indicated as being an $n^-$ silicon meaning a region very lightly doped with phosphorous, while $n^+$ regions represent regions heavily doped with arsenic or phosphorous or antimony, in accordance with a jargon which is immediately comprehended by any skilled technician, notwithstanding the fact that the corresponding actual doping levels may vary within certain limits which are also well known and documented in specific, readily available literature.

What we claim is:

1. An integrated circuit, monolithically integrated in an epitaxial layer of lightly doped silicon of a first conductivity type grown on a monocrystalline, lightly doped silicon of a second conductivity type and comprising complementary, superficial field effect-transistors and bipolar lateral transistors [f] *of* said second conductivity type, each bipolar lateral transistor of said second conductivity type being formed in a region of said epitaxial layer, electrically isolated from said substrate by a heavily doped layer of said first conductivity type formed at the bottom of said region and laterally by bottom isolation diffusions and top isolation or well diffusions merging to form walls of doped silicon of said second conductivity type extending through the entire thickness of said epitaxial layer around said region, each of said bipolar transistors comprising a heavily doped, base contact diffusion of said first conductivity type, a heavily doped emitter diffusion of said second conductivity type and heavily doped, annular collector diffusion of said second conductivity type formed around said emitter diffusion, said base contact, emitter and collector diffusions having respective profiles identical to respective diffusion profiles of source and drain regions of said complementary [filed] *field* effect transistors, and characterized by comprising at least a second annular diffusion of said second conductivity type, having the same diffusion profile of said top isolation or well diffusion of said second conductivity type and extends beyond the profile of the [latter,] *collector diffusion,* deeply within said epitaxial layer, for intercepting [electric current] *carrier flow* originating from said emitter diffusion and for gathering the same to the transistor's collector subtracting it from dispersion toward said isolation diffusions surrounding the transistor region.

2. The integrated circuit according to claim 1, wherein said substrate is a p-type substrate, said epitaxial layer is an $n^-$ type layer, said bipolar lateral transistor is a PNP transistor and said second annular diffusion formed in the collector zone of the PNP transistor has the same diffusion profile of a p-well utilized in an n-channel field effect transistor.

3. The integrated circuit according to claim 2, wherein a superficial region of said second annular diffusion is boron enriched.

*4. An integrated circuit, comprising:*

*a monocrystalline semiconductor epitaxial layer of a first conductivity type overlying a second monocrystalline semiconductor region of a second conductivity type;*

*an emitter region, comprising a shallow heavily-doped diffusion of said second conductivity type, formed in a portion of said epitaxial layer at a surface thereof;*

*a base contact region making ohmic contact to a portion of said epitaxial layer which surrounds said emitter region, and a buried layer of said first conductivity type, at the vertical boundary between said epitaxial layer and said second semiconductor region, beneath said emitter;*

*a collector region, substantially laterally surrounding said emitter region, and comprising*

*a first diffusion of said second conductivity type, formed in a portion of said epitaxial layer at a surface thereof, and having approximately the same dopant diffusion profile as said shallow diffusion of said emitter region;*

*a second diffusion of said second conductivity type, formed in a portion of said epitaxial layer at a surface thereof; said second diffusion abutting said first diffusion and being laterally interposed between said first diffusion and said epitaxial layer; and*

*diffused isolation regions laterally surrounding said collector region, and extending through the full vertical thickness of said epitaxial layer.*

*5. The integrated circuit of claim 4, wherein said first conductivity type is N-type.*

*6. The integrated circuit of claim 4, further comprising a thick oxide layer extending across the surface of said isolated portion, and having apertures therein; and further comprising ohmic contacts to said emitter and collector regions, each extending through a respective aperture in said oxide.*

*7. The integrated circuit of claim 4, wherein said isolation regions each include not only a down-diffusion, but also a respective up-diffusion.*

*8. The integrated circuit of claim 4 wherein said collector region completely surrounds said emitter region.*

*9. An integrated circuit, comprising:*

*a substrate including at least one isolated portion of monocrystalline semiconductor material of a first conductivity type in proximity to a first surface of said substrate;*

*an emitter region, comprising a high concentration of dopants of a second conductivity type, formed at said first surface of said isolated portion;*

*a base contact region making ohmic contact to said isolated portion;*

*a collector region, located in proximity to said emitter region, and laterally separated therefrom by said isolated semiconductor portion, and comprising a high concentration of dopants of said second conductivity type formed at said first surface of said semiconductor portion, and having approximately the same dopant distribution profile as said emitter region; and also comprising*

*a deep diffusion of said second conductivity type, extending into, but not through, said semiconductor portion from said first surface thereof; said deep diffusion abutting said collector region and being laterally interposed between said collector region and said isolated semiconductor portion; and*

*an additional diffusion of said second conductivity type, which is shallower than said deep diffusion; said additional diffusion abutting said deep diffusion and being laterally interposed between said deep diffusion and said isolated semiconductor portion.*

*10. The integrated circuit of claim 9, wherein said first conductivity type is N-type.*

*11. The integrated circuit of claim 9, further comprising a thick oxide layer extending across the surface of said isolated portion, and having apertures therein; and further comprising ohmic contacts to said emitter and collector regions, each extending through a respective aperture in said oxide.*

*12. The integrated circuit of claim 9, wherein said collector region completely surrounds said emitter region.*

*13. An integrated circuit, comprising:*

*a substrate including at least one isolated portion of monocrystalline semiconductor material of a first conductivity type in proximity to a first surface of said substrate;*

*a thick oxide layer extending across the surface of said isolated portion, and having apertures therein;*

*an emitter region, comprising a shallow heavy diffusion of said second conductivity type formed at and in self-alignment to an emitter contact aperture of said thick oxide layer;*

*a base contact region, located at a respective aperture of said thick oxide layer, and making ohmic contact to said isolated portion;*

*a collector region, located in proximity to said emitter region, and laterally separated therefrom by said isolated semiconductor portion, and comprising a high concentration of dopants of said second conductivity type formed at and in self-alignment to a collector contact aperture of said thick oxide layer, and having approximately the same dopant distribution profile as said emitter region; and also comprising*

*a deep diffusion of said second conductivity type, extending into, but not through, said semiconductor portion from said first surface thereof; said deep diffusion not being self-aligned to said collector contact aperture; said deep diffusion abutting said collector region and being laterally interposed between said collector region and said isolated semiconductor portion; and*

*an additional diffusion of said second conductivity type, which is shallower than said deep diffusion and partially coincides therewith; said additional diffusion abutting said deep diffusion and being laterally interposed between said deep diffusion and said isolated semiconductor portion.*

*14. The integrated circuit of claim 13, wherein said first conductivity type is N-type.*

*15. The integrated circuit of claim 13, wherein said bipolar device is fully isolated from other devices on the chip*

*by up/down diffused isolation regions which extend through the full thickness of an epitaxial layer which is of opposite conductivity type from the up/down diffused isolation regions and from the underlying substrate.*

*16. The integrated circuit of claim 13, wherein said bipolar device is fully isolated from other devices on the chip by junction isolation.*

*17. The integrated circuit of claim 13, wherein said collector region completely surrounds said emitter region.*

*18. An integrated circuit device structure, comprising:*

*a substrate including, in proximity to a first surface thereof, at least one first portion of monocrystalline semiconductor material of a first conductivity type, at least one second portion of monocrystalline semiconductor material of a second conductivity type, and at least one isolated portion of monocrystalline semiconductor material of a first conductivity type;*

*at least one said first portion including therein a field-effect transistor having source/drain diffusions corresponding to a shallow heavy concentration of dopants of said second conductivity type;*

*at least one said second portion including therein a field-effect transistor having source/drain diffusions corresponding to a shallow heavy concentration of dopants of said first conductivity type;*

*and at least one said isolated portion including therein a bipolar transistor comprising:*

*an emitter region, comprising a high concentration of dopants of a second conductivity type, formed at said first surface of said isolated portion;*

*a base contact region making ohmic contact to said isolated portion;*

*a collector region, located in proximity to said emitter region, and laterally separated therefrom by said isolated semiconductor portion, and comprising:*

*a first diffusion corresponding to the dopant distribution profile of said source/drain diffusions in said second portion;*

*a deep diffusion substantially corresponding to the dopant distribution profile of said second portion; said deep diffusion abutting said collector region and being laterally interposed between said collector region and said isolated semiconductor portion: and*

*an additional diffusion of said second conductivity type, which is shallower than said deep diffusion; said additional diffusion abutting said deep diffusion and being laterally interposed between said deep diffusion and said isolated semiconductor portion;*

*wherein said bipolar device is fully isolated from other devices on the chip.*

*19. The integrated circuit of claim 18, wherein said first conductivity type is N-type.*

*20. The integrated circuit of claim 18, further comprising a thick oxide layer extending across the surface of said isolated portion, and having apertures therein; and further comprising ohmic contacts to said emitter and collector regions, each extending through a respective aperture in said oxide.*

*21. The integrated circuit of claim 18, wherein said bipolar device is fully isolated from other devices on the chip by up/down diffused isolation regions which extend through the full thickness of an epitaxial layer which is of opposite conductivity type from the up/down diffused isolation regions and from the underlying substrate.*

*22. The integrated circuit of claim 18, wherein said bipolar device is fully isolated from other devices on the chip by junction isolation.*

*23. The integrated circuit of claim 18, wherein said collector region completely surrounds said emitter region.*

*24. An integrated circuit, comprising:*

*a monocrystalline semiconductor epitaxial layer of a first conductivity type overlying a second monocrystalline semiconductor region of a second conductivity type;*

*well regions of said second conductivity type, comprising both a down-diffusion into said epitaxial layer and also a corresponding up-diffusion into said epitaxial layer;*

*at least one field-effect transistor having source/drain diffusions corresponding to a shallow heavy concentration of dopants of said second conductivity type;*

*at least one said well region including therein a field-effect transistor having source/drain diffusions corresponding to a shallow heavy concentration of dopants of said first conductivity type;*

*at least one isolated portion of said epitaxial layer including therein a bipolar transistor comprising:*

*an emitter region, comprising a high concentration of dopants of a second conductivity type, having a dopant distribution profile corresponding to said source/drain diffusions of said second conductivity type;*

*a base contact region making ohmic contact to said isolated portion;*

*a collector region located in proximity to said emitter region, and laterally separated therefrom by said isolated semiconductor portion, and comprising:*

*a first diffusion corresponding to the dopant distribution profile of said source/drain diffusions of said second conductivity type;*

*a deep diffusion substantially corresponding to the dopant distribution profile of said down-diffusion, but not said up-diffusion, of said well regions; and*

*diffused isolation regions laterally surrounding said collector region, and extending through the full vertical thickness of said epitaxial layer.*

*25. The integrated circuit of claim 24, wherein said first conductivity type is N-type.*

*26. The integrated circuit of claim 24, further comprising a buried layer of said first conductivity type, beneath said first aperture, at the vertical boundary between said epitaxial layer and said second monocrystalline region.*

*27. The integrated circuit of claim 24, further comprising a thick oxide layer extending across the surface of said isolated portion, and having apertures therein; and further comprising ohmic contacts to said emitter and collector regions, each extending through a respective aperture in said oxide.*

*28. The integrated circuit of claim 24, wherein said isolation regions each include not only a down-diffusion, but also a respective up-diffusion.*

*29. The integrated circuit of claim 24, wherein said collector region completely surrounds said emitter region.*

*30. An integrated circuit device structure comprising:*

*a monocrystalline semiconductor epitaxial layer of a first conductivity type overlying a second monocrystalline semiconductor region of a second conductivity type;*

*a thick oxide layer extending across the surface of said epitaxial layer, and having therein a first aperture, and a second aperture, separate from said first aperture, which surrounds said first aperture;*

*a first diffusion, comprising a shallow heavy diffusion of said second conductivity type, formed at and in self-alignment to said first and second apertures;*

*a second diffusion comprising a diffusion of said second conductivity type which is deeper than and has a lower concentration than said first diffusion, and which is formed under said second aperture but not said first aperture;*

*a third diffusion of said second conductivity type, which is formed in proximity to said second aperture but not said first aperture, and which is shallower than said second diffusion and partially coincides therewith; and*

*diffused isolation regions laterally surrounding said first diffusion, and extending through the full vertical thickness of said epitaxial layer.*

*31. The integrated circuit of claim 30, wherein said first conductivity type is N-type.*

*32. The integrated circuit of claim 30, further comprising a buried layer of said first conductivity type, beneath said first aperture, at the vertical boundary between said epitaxial layer and said second monocrystalline region.*

*33. The integrated circuit of claim 30, wherein said isolation regions each include not only a down-diffusion, but also a respective up-diffusion.*

*34. The integrated circuit of claim 30, wherein said collector region completely surrounds said emitter region.*

* * * * *